US010197612B2

(12) United States Patent
Griffiths et al.

(10) Patent No.: US 10,197,612 B2
(45) Date of Patent: Feb. 5, 2019

(54) CONTINUITY TEST SYSTEM AND METHOD

(71) Applicant: The Peak Group Pty Limited, Warners Bay, NSW (AU)

(72) Inventors: Paul Griffiths, Windella (AU); Darren Woodhouse, Tenambit (AU)

(73) Assignee: The Peak Group Pty Limited, Warners Bay, NSW (AU)

( * ) Notice: Subject to any disclaimer, the term of this patent is extended or adjusted under 35 U.S.C. 154(b) by 72 days.

(21) Appl. No.: 15/307,179

(22) PCT Filed: Apr. 29, 2015

(86) PCT No.: PCT/AU2015/050203
§ 371 (c)(1),
(2) Date: Oct. 27, 2016

(87) PCT Pub. No.: WO2015/164924
PCT Pub. Date: Nov. 5, 2015

(65) Prior Publication Data
US 2017/0059638 A1    Mar. 2, 2017

(30) Foreign Application Priority Data

Apr. 30, 2014 (AU) ............................... 2014901562

(51) Int. Cl.
*G01R 31/02* (2006.01)
*G01R 1/067* (2006.01)

(52) U.S. Cl.
CPC ....... *G01R 31/026* (2013.01); *G01R 1/06788* (2013.01)

(58) Field of Classification Search
CPC .................................................. G01R 31/026
See application file for complete search history.

(56) References Cited

U.S. PATENT DOCUMENTS 3,376,502 A    4/1968  Rink
4,152,639 A *  5/1979  Chaffee ................ G01R 31/026
                                                    324/133

(Continued)

FOREIGN PATENT DOCUMENTS

JP           59-043373 A         3/1984

OTHER PUBLICATIONS

Continuity testing, https://www.youtube.com/watch?v=m6YQs, 2013.*

(Continued)

*Primary Examiner* — Patrick Assouad
*Assistant Examiner* — Demetrius Pretlow
(74) *Attorney, Agent, or Firm* — Kilpatrick Townsend & Stockton

(57) ABSTRACT

A continuity test system (100), includes a base unit (1) and a mobile unit (9). The base unit (1) is adapted to be connected to a first portion of a test item, and, the mobile unit (9) is both interconnected to said base unit (1), and adapted to be connected to a second portion of said test item. The continuity test system (100) includes a signal generator (2), adapted to generate a dual polarity measurement signal, a measurement unit (14), adapted to measure electrical parameters of said test item (16)as said dual polarity measurement signal is applied thereto, and, a processor (13, 4), to process said measured electrical parameters and provide a resultant continuity test signal output.

14 Claims, 15 Drawing Sheets

(56) References Cited

U.S. PATENT DOCUMENTS

| | | | | | |
|---|---|---|---|---|---|
| 4,905,261 | A | * | 2/1990 | Knight | G01R 31/026 324/505 |
| 4,949,274 | A | * | 8/1990 | Hollander | G01R 31/2834 324/142 |
| 5,397,996 | A | * | 3/1995 | Keezer | G01R 31/026 324/133 |
| 5,627,474 | A | * | 5/1997 | Baudisch | G01R 31/023 324/539 |
| 6,130,530 | A | * | 10/2000 | McNulty | G01R 15/12 324/546 |
| 7,816,925 | B1 | * | 10/2010 | Gale | G01R 31/021 324/543 |
| 9,046,564 | B1 | * | 6/2015 | Griffin | G01R 31/006 |
| 2013/0221973 | A1 | * | 8/2013 | Whisenand | G01R 31/1272 324/501 |

OTHER PUBLICATIONS

International Search Report corresponding to PCT/AU2015/050203, dated Jul. 6, 2015.
International Preliminary Report on Patentability corresponding to PCT/AU2015/050203, dated May 23, 2016.

* cited by examiner

CONTINUITY TEST SYSTEM AND METHOD

BACKGROUND OF THE INVENTION

The invention relates to an electrical continuity test system and method, and in particular, to test equipment usable for testing electrical continuity.

DESCRIPTION OF THE PRIOR ART

The reference in this specification to any prior publication (or information derived from it), or to any matter which is known, is not, and should not be taken as, an acknowledgement or admission or any form of suggestion that prior publication (or information derived from it) or known matter forms part of the common general knowledge in the field of endeavour to which this specification relates.

Electrical continuity testing is the process of determining if an electrical path can be established between two points. This could be two points on a conductor, two points on a network of conductors, two points on a conductive building or structural framework, or, two points on any other object or installation where electrical connectivity is of interest.

There are two general methods of testing for continuity. The first does not include measurement, but typically includes an indicator such as a buzzer or lamp that becomes active when the resistance of the path is sufficiently low. The second includes a measurement of resistance between the two points. In many applications, measuring the resistance is essential in adequately understanding the system or item being tested. In some applications, a high level of accuracy is required. Devices and systems for measuring resistance typically apply a known voltage (or current) between the two points and measure the resultant current (or voltage) between the two points, and then, the two values are divided in accordance with Ohm's law to determine the resistance.

In the past, the effectiveness of continuity testing requiring measurement of resistance is impacted by a number of factors, including electrical interference, which reduces accuracy, and distance, which can reduce accuracy and/or make single-person testing impracticable.

Electrical interference can be present, either on the item under test, or, on the test device or system. This could be a result of connected electrical devices or of electrostatic or electromagnetic coupling with other nearby devices or systems. Interference could be a combination of high frequency AC, power frequency AC, very low frequency AC or even DC. In each case, electrical interference can substantially reduce the accuracy of measurements. Some existing test devices or systems utilise filtering to mitigate the effect of interference; some employ a method of reversing the direction of the applied voltage (or current) and making multiple measurements to eliminate low frequency and DC interference. Some use additional measurements, sometimes requiring additional wires.

Test points can be separated by large distances. This can exacerbate the effects of noise, as identified above. It can also make it impracticable to test with a single person. Some test systems use two interconnected devices, a base unit and a mobile unit, to make single-person testing feasible, however, accuracy, functionality, reliability or battery-life are typically reduced.

SUMMARY OF THE INVENTION

The present invention seeks to improve continuity testing by overcoming at least some of the difficulties inherent in known systems, and at the same time offering a useful alternative choice.

The present invention also seeks to provide a method of ensuring the integrity of the conductors interconnecting a base unit and mobile unit of separated test systems, without negatively impacting system performance.

The present invention also seeks to provide a continuity test system which functions in a flexible, adaptive way to optimise the performance of any measurement over physically large distances utilising a pair of interactive devices, one being a base signal generation unit which works in tandem with a mobile portable measurement unit to test continuity.

In one broad form, the present invention provides a continuity test system including:

a signal generator, adapted to generate a dual polarity measurement signal;

a measurement unit, adapted to measure electrical parameters of a test item as said dual polarity measurement signal is applied thereto; and, a processor, adapted to process said electrical parameters and provide a resultant continuity test output.

Preferably, said electrical parameters include voltage and/or current.

Also preferably, the system includes a base unit, adapted to be connected to a first portion of said test item; and, a mobile unit, adapted to be interconnected to said base unit, and, to be connected to a second portion of said test item.

Preferably, said base unit includes said signal generator.

Also preferably, said mobile unit includes said measurement unit.

Preferably, said base unit and/or said mobile unit includes said processor.

Also preferably, a communications channel is provided between said base unit and said mobile unit, wherein said communications channel may be a wired or wireless communications channel.

Preferably, said dual polarity measurement signal is implemented using a controllable switching device, including any one or combination of a transistor (BJT, FET, etc.) a relay, and/or a solid state switching device.

Also preferably, said electrical parameters are measured using a measurement device, including any one or combination of a Kelvin clamp, and, a Kelvin probe.

Preferably, the system further includes a user interface, including a display, to display said continuity test output.

In a further broad form, the present invention provides a continuity test method including the steps of:

generating a dual-polarity measurement signal;

measuring electrical parameters of a test item as said dual-polarity test signal is applied thereto; and, processing said electrical parameters to provide a resultant continuity test output.

Preferably, the method includes the preliminary step of:

performing a pre-measurement test to verify correct operation/connection of continuity test apparatus components.

Preferably, said electrical parameters are voltage and/or current.

In another form, the present invention provides a base unit of a continuity test system, in which the continuity test system also includes a mobile unit, and, in which the continuity test system includes:

a signal generator, adapted to generate a dual polarity measurement signal;

a measurement unit, adapted to measure electrical parameters of a test item as said dual polarity measurement signal is applied thereto; and, a processor, adapted to process said electrical parameters and provide a resultant continuity test output.

In another form, the present invention provides a mobile unit of a continuity test system, in which the continuity test system also includes a base unit, and, in which the continuity test system includes:

generating a dual-polarity measurement signal;

measuring electrical parameters of a test item as said dual-polarity test signal is applied thereto; and, provide a resultant continuity test output.

In a further broad form, the present invention provides a continuity test system, including:

a base unit adapted to be connected to a first portion of a test item; and, a mobile unit interconnected to said base unit and adapted to be connected to a second portion of said test item;

said continuity test system including:

a signal generator, adapted to generate a dual polarity measurement signal;

a measurement unit, adapted to measure electrical parameters of said test item as said dual polarity measurement signal is applied thereto; and, a processor, to process said measured electrical parameters and provide a resultant continuity test signal output.

The test system of the present invention may enable a single operator to measure low resistances quickly and accurately between a reference point and remote locations typically over distances up to 200 metres or more, whilst preferably the low resistance measurements are highly accurate, typically to within 0.1 mΩ.

The continuity test system of the present invention seeks to provide accurate measurement even with background electrical noise and other interference, which often exists on in-service systems.

The base unit and mobile unit may typically be interconnected by a two-wire test lead, which can simultaneously provide multiple functions including: signal injection and measurement; mobile unit battery charging; and, communications and distributed control.

The base unit may typically include any one or combination of:

means for generation of a switched polarity DC measurement signal;

a module to receive messages sent from the mobile unit and change the output of the base unit as a result; and a module to supply energy to charge the batteries of the mobile unit via the measurement circuit.

The mobile unit may typically include a microprocessor system enabling various functions, which may include any one or combination of:

advanced measurement and analysis;

interactivity with an operator, including display of information;

communication with the base unit, which could be wireless or via the interconnected measurement lead;

control of various aspects of the base unit, including DC signal polarity switching; and charging of an internal battery of the mobile unit when the unit is not making measurements.

The present invention also seeks to provide a lead integrity test system, which functions to confirm the electrical continuity of an interconnecting lead between base and mobile units without compromising the speed or accuracy of a measurement or measurements that is or are being performed simultaneously using the interconnecting lead.

The lead integrity test system may typically include:

an integrity signal generation module;

a module to transfer the integrity signal onto the interconnecting lead without detriment to the normal function or performance of the lead; and a means of detecting the integrity signal in the mobile unit.

BRIEF DESCRIPTION OF THE DRAWINGS

The present invention will become more fully understood from the following description of preferred but non-limiting examples of the invention, wherein.

DETAILED DESCRIPTION OF THE PREFERRED EMBODIMENTS

Throughout the drawings, like numerals will be used to identify like features, except where expressly otherwise indicated.

Figure 1:
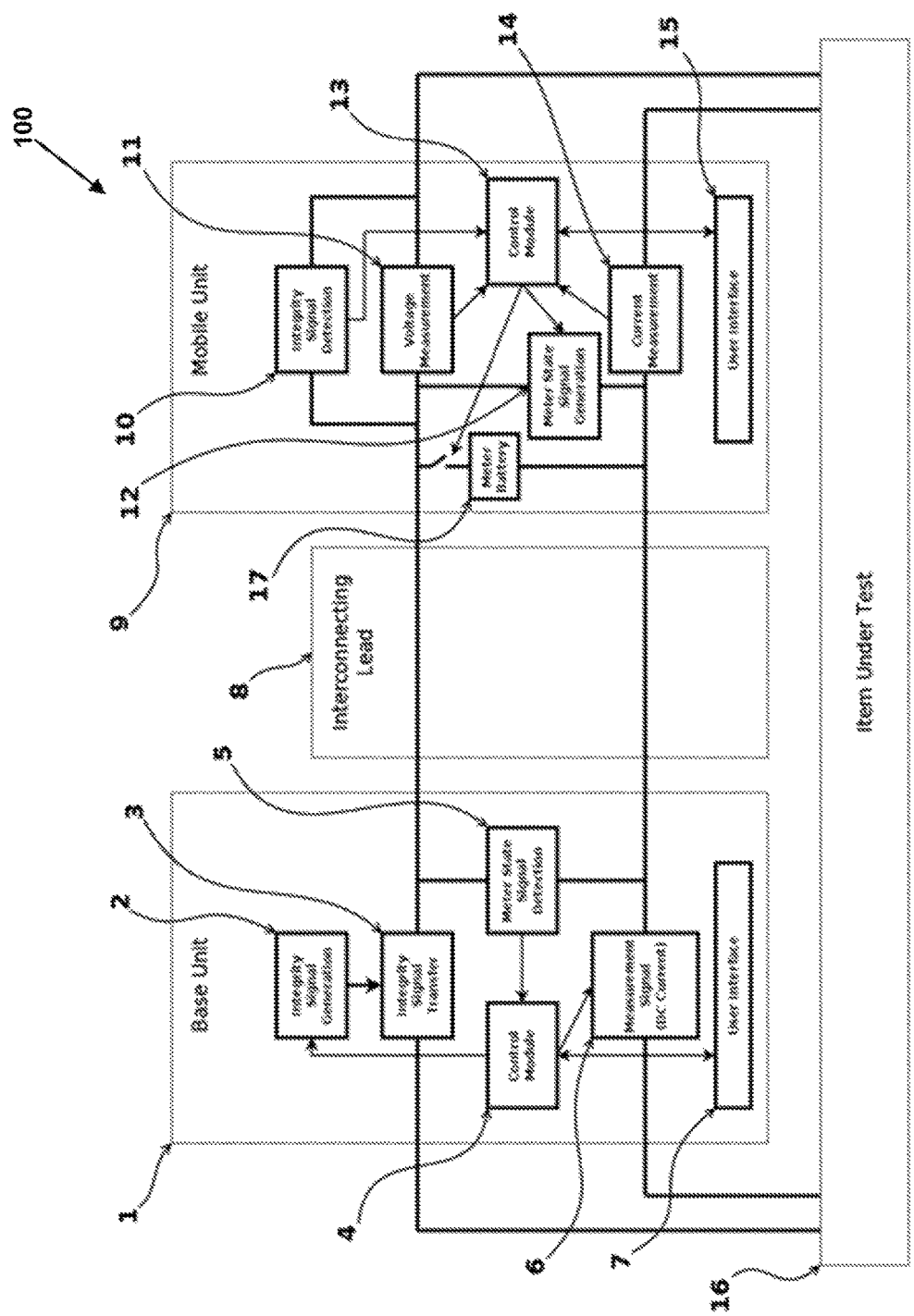
FIG. 1 shows a schematic drawing of an example of a continuity test system according to the invention.

FIG. 1 shows an example of a continuity test system 100 in accordance with the present invention including a base unit 1, a mobile unit 9, and an interconnecting lead 8. In the embodiment shown, the base unit 1 includes a signal generator means 6 for generation of a switched polarity DC measurement signal. The interconnecting lead 8 typically includes two or more conductors, and, may typically be more than 200 m long. The mobile unit 9 typically includes means to measure electrical parameters such as voltage 11 and current 14, and, a control module or processor 13 that is capable of advanced signal filtering and calculation of the resistance of the test item.

Communication of data between the mobile unit 9 to the base unit 1 may be achieved over the interconnecting lead 8, or, the communications may alternatively be wireless. The mobile unit control module 13 may thereby share information with the corresponding base unit control module 4 via a meter state signal generation module 12 and a meter state signal detection module 5. This communication allows the mobile unit 9 to affect changes in the measurement signal 6.

The base unit 1 may be powered by an internal battery, which may include an optional external power supply. The mobile unit 9 is powered by an internal battery 17 and can be charged by drawing energy from the base unit 1 via the interconnecting lead 8 without detriment to the normal measurement functions.

The system may include a feature to verify the integrity of the interconnecting lead 8 by the generation of an integrity signal 2 and the transfer 3 of it onto the interconnecting lead 8 without detriment to the lead's measurement and charging functions. The mobile unit 9 may include a means 10 of detecting the integrity signal and reporting its status to the control module 13 for appropriate action.

The system may include user interface 7 in the base unit 1 and a user interface 15 in the mobile unit 9.

Further details of the various features illustrated in FIG. 1 will now be hereinafter described, with reference to specific non-limiting examples.

The integrity signal generation unit 2 creates a signal, which the mobile unit 9 can use to verify that the test leads are intact. The signal may typically nominally be a 2 kHz sine wave, with 200 mV amplitude. The integrity signal generation unit 2 enables detection of broken leads, which was not possible with past solutions. A damaged or broken voltage lead can typically result in lower resistance readings than are in place. As such, this feature of the present invention provides increased confidence in the measurement results and the state of equipment. The integrity signal generation unit 2 may typically be implemented via an integrated circuit 'tone detector chip' provided in the base unit to both generate and detect the tone. Detecting the tone forms part of the meter state signal detection unit 5, as will be described hereinafter. The tone detector chip is preferably configured to output a 2 kHz tone, which is coupled onto the test leads by the integrity signal transfer unit 3 which may be implemented with a transformer. In the mobile unit 9, this tone is used by the integrity signal detection unit 10, and the meter state signal generation unit 12. As will be understood by persons skilled in the art, the signal does not have to be 2 kHz pure tone. Almost any signal that can be detected at the other end, e.g. pulses, square wave, combination of tones at different frequencies, etc., may alternatively be used. Other variations may include using a custom circuit to generate signal rather than commercial IC, generating a signal by a microcontroller & D/A converters, and, larger/smaller amplitude signals could be used.

The integrity signal transfer unit 3 impresses an integrity signal onto the voltage test lead without interfering with the normal function of the lead, and other parts of the measurement circuit. This feature may be implemented by using a transformer, with the primary winding driven by the signal from the integrity signal generation unit 2, and the secondary winding being inserted in series with the voltage test lead. Fundamentally this feature operates like all transformers, current on primary side is converted to voltage on the secondary. But since the transformer only passes AC signals, there is no interference with the normal DC measurement functions. Alternatively, FETs or other solid state switching devices could be used, along with an appropriate control scheme instead of the transformer.

The base unit control module 4 interfaces, controls and coordinates other functional blocks. The features nominally implemented by this unit are the polarity swapping control, and the detection of 'requests' from the mobile unit. The unit may include a fall-back timer mode if high levels of noise detected that might be interfering with signalling channel, and, a timer to limit the duration of negative current to avoid discharging batteries in the mobile unit 9. This is preferably implemented with discrete circuitry distributed between the functional modules to provide more advanced control, including a combination of polarity swapping, broken lead detection, and, communications between the hand unit and base unit. Control algorithms may be used to enable a number of other features, and discrete circuitry may be implemented to remove the requirement for a microcontroller. The base unit control module 4 may be implemented via various circuits that detect certain conditions in other parts of the base unit 9, and relay various control signals to other functional units. This control unit therefore coordinates the other functional units of the system to enable the various important functions of the system, such as polarity swapping, and lead integrity detection to work. A meter state signal detection unit 5 enables the mobile unit 9 to communicate in a limited fashion, back to the base unit 1, by detecting changes in the lead integrity signal on the test leads. No additional wires are required for these communications, as the existing (2-core) test leads may be used with the system. The tone detection chip which is used for the integrity signal generation unit 2 may also be used to detect the tone on the test leads. Normally the tone is only present on the voltage lead, but when a polarity swap is requested by the mobile unit 9, a load is placed between the voltage and current leads by the meter state signal generation unit 12. This load is an open circuit at DC, so it does not interfere with the measurement, but rather allows the tone current to flow in the current lead.

The meter state signal detection unit 5 interprets this condition of the tone on current lead, as a request to change the polarity, which is relayed to the control modules 4. Any general purpose communications system (e.g. modulated digital signals) on the test leads, or, wireless communications could alternatively be used between the mobile unit 9 and the base unit 1, implementations of which will be readily understood by persons skilled in the art.

The measurement signal generation unit 6 may typically be a DC current source, which can swap polarity when required. Nominally 1A may typically be used in this implementation. Polarity swapping provides considerably higher accuracy for measurements. The implementation of the current source reaches a stable set-point faster, that is, a shorter time is required to reach stability, which reduces total measurement time. Polarity swapping provides more accurate results, and better immunity to noise. The signal generator unit 6 provides the source of current for performing the resistance measurements, and, may be typically implemented by providing a voltage reference chip being used to apply a fixed voltage across a known resistance in series with the current lead in the test circuit, which in turn causes a known (and fixed) amount of current to flow in the test circuit. The polarity swapping of the present invention may typically be implemented with a conventional 4 MOSFET full bridge, and some additional Bipolar Transistors to avoid the need for expensive components/circuits (e.g. isolating gate drivers). Other approaches, such a using a negative power supply rail could alternatively be used. The current source portion of this module operates continuously and tries to drive 1A around the test loop. The output configuration of the MOSFET bridge, and hence the polarity of test current, is set by the control module 4. While it is nominally a 1A source, there is current measurement 14 functionality in the mobile unit 9, to compensate for any variation in the test current. When the mobile unit 9 is not actively performing a measurement, it has the ability to connect the current source to the meter battery 17, to provide a continuous recharging function for the mobile unit 9. Persons skilled in the art will appreciate that variations may include using a different current magnitude, e.g. greater than 1A, and/or, using a fixed polarity switching frequency to minimize complications of communicating with the mobile unit.

The user interface unit 7 may include various buttons and indicator lights on the front panel of the base unit 1.

The interconnecting lead 8 may typically be embodied as a twin core cable, to complete the current and voltage measurement circuits between the base unit 1, the mobile unit 9, and, the item under test 16. The interconnecting lead 8 is a critical component of the split-system design, as it allows testing to be performed over a much wider range (typically 200 m) than traditional integrated solutions allow (single joint).

The integrity signal detection unit 10 is, in essence, a filter tuned to pick out the signal impressed on the test lead by the base unit 1. It may be implemented as a band-pass filter constructed from a combination of high-pass and low-pass filter circuits. The output of this may be rectified and accumulated to provide a continuous signal to the microcontroller in the control module 13. The filtering circuits are preferably designed to provide a 'load' on the circuit at the tone frequency, to minimise the chance of induced noise being falsely identified as the tone. The filter circuits in the integrity signal detection unit 10 are preferably tuned to match the tone created in the integrity signal generation unit 2. The output of this module is fed into the control module 13. If a tone cannot be detected, this is interpreted as a broken voltage lead and the control module 13 can then trigger error messages in the user interface 15, if required. Alternatively, sampling and various digital signal-processing algorithms could be used to identify the integrity signal.

The voltage measurement unit 11 includes basic circuits for filtering and ranging before the A/D converters in the microcontroller.

The meter state signal generation unit 12 passes the tone generated by the integrity signal generation module 2 from the voltage lead onto the current lead, to provide a signalling channel back to the base unit 1. In effect, a high-pass filter is switched into the circuit as a shunt between the voltage and current test leads under the control of the control module 13, to allow the 2 kHz tone to pass to the current lead without interfering with the normal measurement process. The switching in this embodiment is achieved using a photo-resistive opto-isolator, however alternative implementations would be apparent to persons skilled in the art, such as using transistors or relays although these approaches may have drawbacks such as limited switching speed or audible clicking. When the meter state signal generation unit 12 switches the high pass filter into the circuit, the 2 kHz tone is passed to the current test lead, which is detected by the meter state signal detection unit 5 in the base unit 1.

The control module in the mobile unit 13 is preferably a microcontroller based coordination and control for all the other modules in the mobile unit 9. Previous controllers in split-system designs were limited to measurement functions only. This controller enables the other features such as control over the polarity swapping, lead integrity monitoring, and battery charging. A microcontroller receives signals and inputs from other modules in the mobile unit, and the software decides what to do in response to the various inputs. The microcontroller operates to effectively coordinate of all the various modules in the mobile unit 9. Alternatively, this feature could be implemented with various discrete circuits.

The current measurement unit 14 is typically embodied as a high precision shunt resistor used to produce a voltage proportional to the current. This voltage is then fed into A/D converters in the microcontroller. Alternative implementations could use a current transformer, or similar. The unit could include temperature compensation by measuring temperature of resistor and applying appropriate correction.

The user interface 15 is typically implemented to include a keypad, LCD screen, and indicator lights on the mobile units with which the user interacts. The microcontroller may typically drive a graphic LCD display and indicator light. It may also include various buttons from the keypad connected to inputs. The software interprets the button presses and internal state to display various information on the LCD screen. Alternatively, numerical displays, switches, dials, etc. could be used.

The meter battery unit 17, typically consists of a rechargeable battery and associated charging circuitry in the mobile unit 9. The system as a whole is configured to recharge the battery between measurements, so the battery does not need to be replaced, and should never run flat in normal usage. Previous 'split-system' designs did not have the automatic charging feature, so spare batteries had to be carried while testing. This feature of the present invention has the advantage that there is no need replace batteries in the mobile unit. The feature may be typically implemented so that the microcontroller in the control module 13 operates a switch that effectively places the battery between the two test leads, which allows current from the measurement signal 6 to flow around the circuit and recharge the battery. The switch is typically implemented with a pair of FETs in a back-to-back arrangement, but other alternatives would be apparent to persons skilled in the art. The control module 13 interacts with all the other features, and determines when the battery charging circuitry may be enabled without interfering with a measurement, or other functioning of the device. It is also reliant on the measurement signal 6 attempting to drive current whenever there is a complete circuit, otherwise some form of communication would be required to 'turn on' the current source. The switch may alternatively be implemented with a relay, or similar, so long as the 'on resistance' is relatively low, as it limits the charge current. A 'Manual' charge mode could alternatively be implemented (rather than automatically charging between measurements), although this would approach be inferior from a user perspective.

Figure 2:
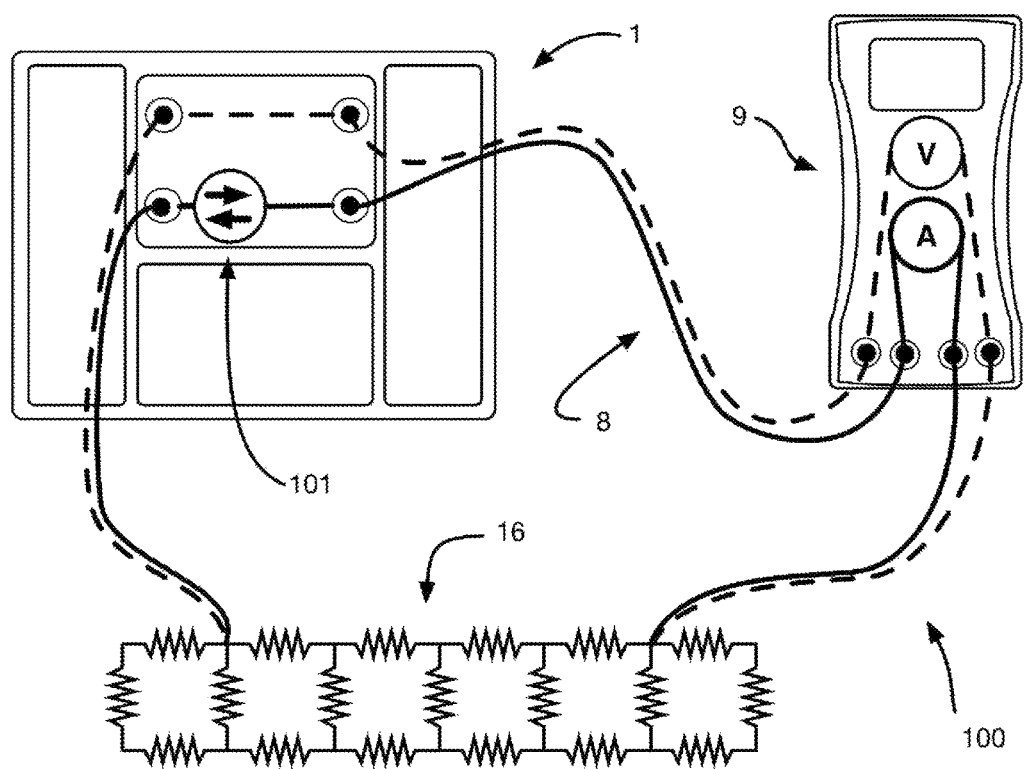
FIG. 2 illustrates a schematic view of a continuity test system in accordance with the present invention.

FIG. 2 shows a representation of the overall continuity test system 100 of the present invention, including the base unit 1, and the mobile unit 9, interconnected to each other via an interconnecting lead 8, and also schematically illustrating an item under test 16. That is the test item may be any resistance/impedance, as schematically represented in FIG. 2. The base unit 1 is shown to include a switching mechanism 101 to enable polarity swapping of the measurement signal, as will be hereinafter described.

Figure 3:
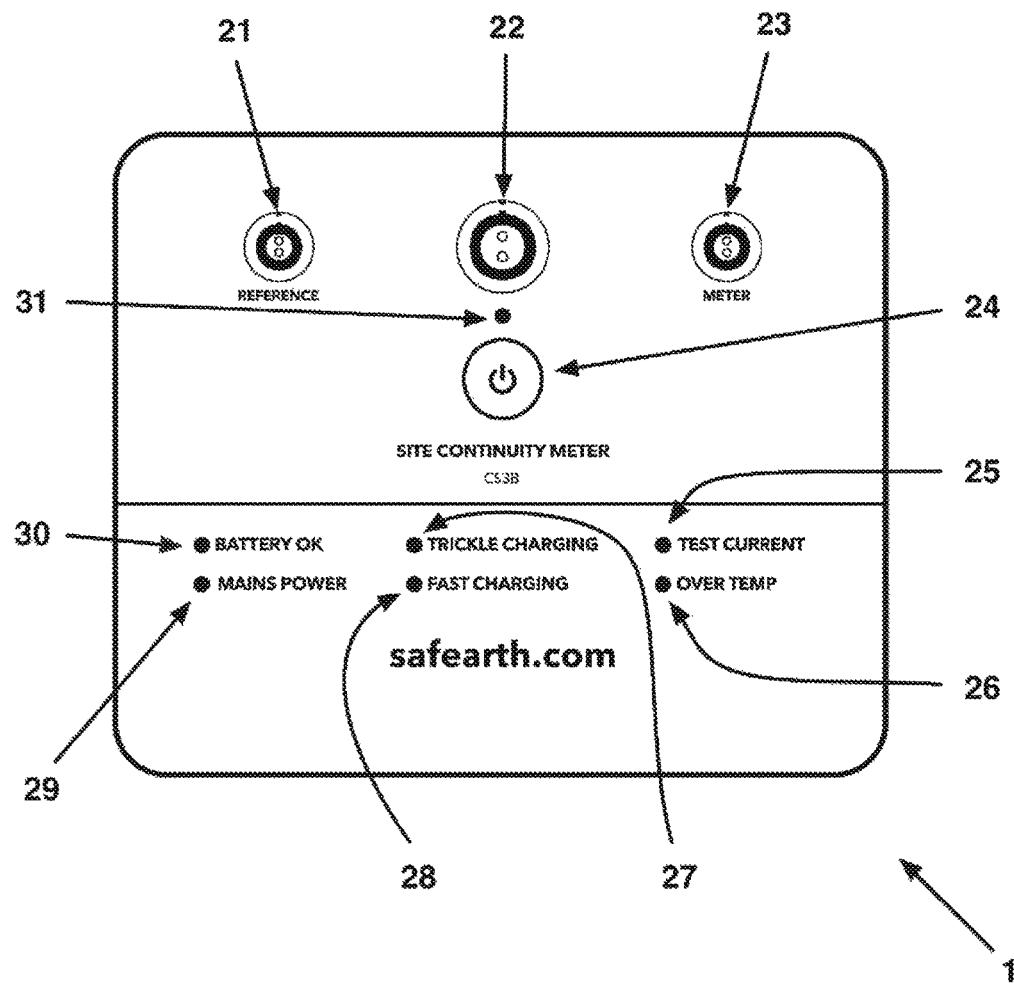
FIG. 3 illustrates an example of a "base unit" implementation in accordance with the present invention.

The continuity test system of the present invention is therefore capable of providing any one or combination of the following features:

DC test with polarity switching:
    Automatically accounts for DC offset
    Not susceptible to induction or other AC interference
4-wire connection accounts for lead impedance
Separate lightweight, intelligent hand unit:
    Improved accuracy due to current measurement
    Improved portability, enabling single user operation
    Improved speed, reducing cost of test
High AC noise immunity allows in-service testing
Accurate with long leads (200 m+)
Detect open and short circuits in test leads
Low power; test with or without external power supply
Fastest and most accurate integrity test method available FIG. 3 shows a typical implementation of the front face of the base unit 1, illustrated in FIG. 2. The base unit 1 may typically include a reference socket 21, for connection of the base unit 1 via Kelvin Clamp to a reference point, which may typically be the main (or a major) earth bar. The base unit 1 also typically includes a power socket 22 to connect to a plug pack to charge internal battery, and, a meter socket 23 for connection to a meter, ether directly when performing a local test, or, via an extended test lead for a remote test. The base unit 1 may further include a power button 24, and a test current LED 25 which may illuminate when the test current flows during the measurement process, and over temperature LED 26 illuminates if the internal temperature of the base unit exceeds the maximum design operating temperature. No test current will be supplied for taking measurements while this light is on, and the power LED will turn off, however the battery will continue to charge. A trickle charging LED 27 is provided to illuminate if the internal battery is trickle charging from mains power, and, a fast charging LED 28 illuminates if the internal battery is fast charging from mains power. A mains power LED 29 illuminates when mains power is supplied to the power socket 22. A battery OK LED 30 may flash once every 2 seconds if the battery is OK, and, may remain off if the battery is low, whilst a power LED 31 may illuminate when the base unit is powered on.

Figure 4:
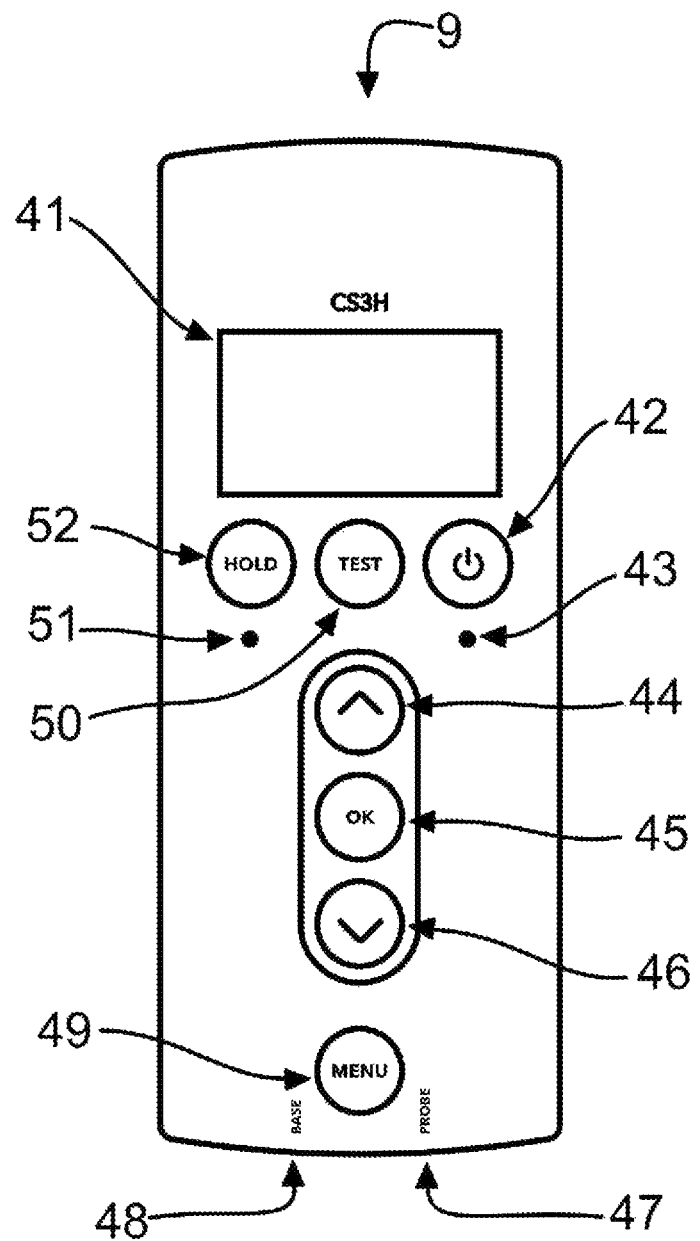
FIG. 4 illustrates an example of a "mobile unit" implementation in accordance with the present invention.

FIG. 4 shows a typical implementation of the front face of the mobile unit 9 illustrated in FIG. 2. The mobile unit 9, may typically include an LCD screen 41, a power button 42, and, a power LED 43, which illuminates when the meter is powered on, typically flashing once every 2 seconds when the meter is in standby mode. An up button 44, an OK button 45, and a down button 46 may be provided. A probe socket 47 may be provided for connection to Kelvin Probe, and a base socket 48 may be provided for connection to base unit, ether directly when performing a local test, or via an extended test lead for a remote test. A menu button 49 may enable access the menu system, whilst a test button 50 may activate the self-test procedure. A hold LED 51 may illuminate when the hold function is active, and a hold button 52 may activate the hold function.

Figure 5:
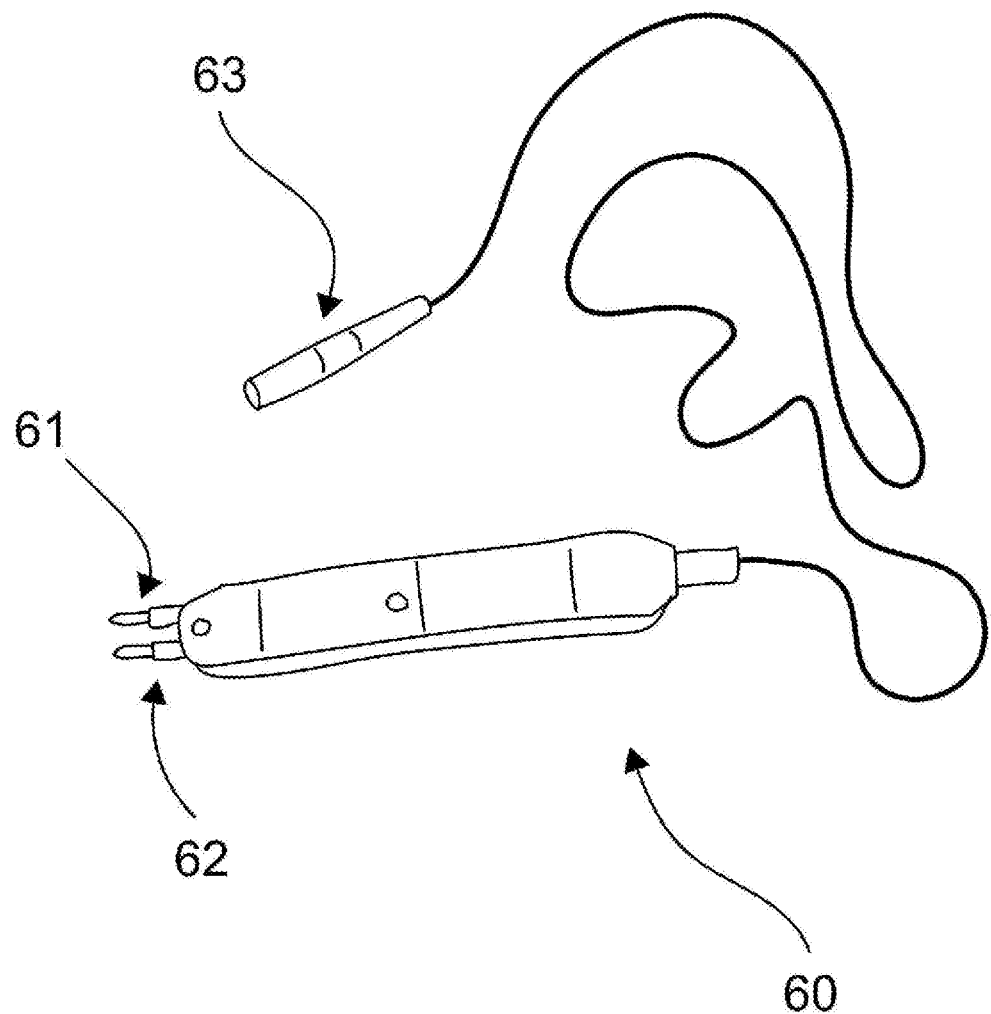
FIG. 5 illustrates an example of a Kelvin probe which typically may be used to connect the mobile unit to the test item.

FIG. 5 shows a typical implementation of a Kelvin Probe 60 which includes a current probe 61, a potential probe 62, and, a lead 63 which is connected to the mobile unit 9. The Kelvin Probe 60 may typically be used to make a temporary connection to the test item. While the Kelvin Probe is preferably designed to minimise the effort required to make adequate connection to the test item, as the physical surface condition of the test item can have a significant impact on the quality of the connection. To ensure a good connection, the test point should be clean bare metal.

Figure 6:
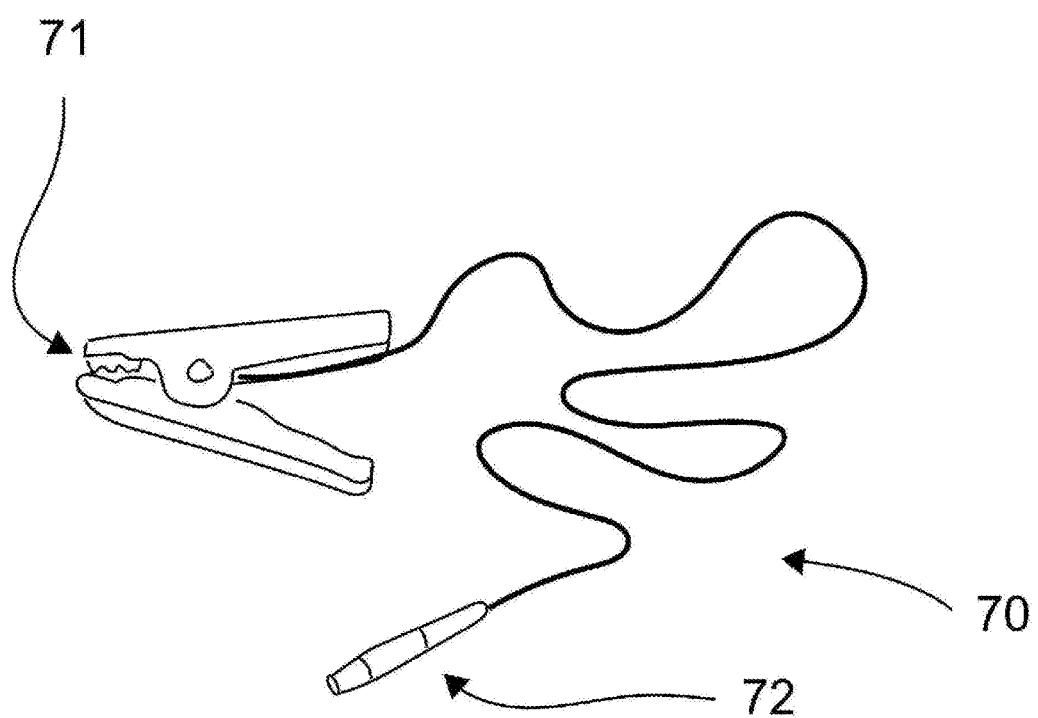
FIG. 6 illustrates an example of a Kelvin clamp which typically may be used to connect the base unit to the test item.

FIG. 6 shows a typical implementation of a Kelvin Clamp 70, showing the current and potential jaws 71 and the lead 72 which is connected to the base unit 1. The Kelvin Clamp 70 may be designed to maintain a solid electrical connection to the reference point over the entire duration of testing. The reference point is typically an earth bar or another significant component of the earthing system. In use, care should be taken to ensure there is good electrical contact to between the current & potential jaws and the reference point. To achieve a high quality connection, the reference point should be clean bare metal.

Figure 7:
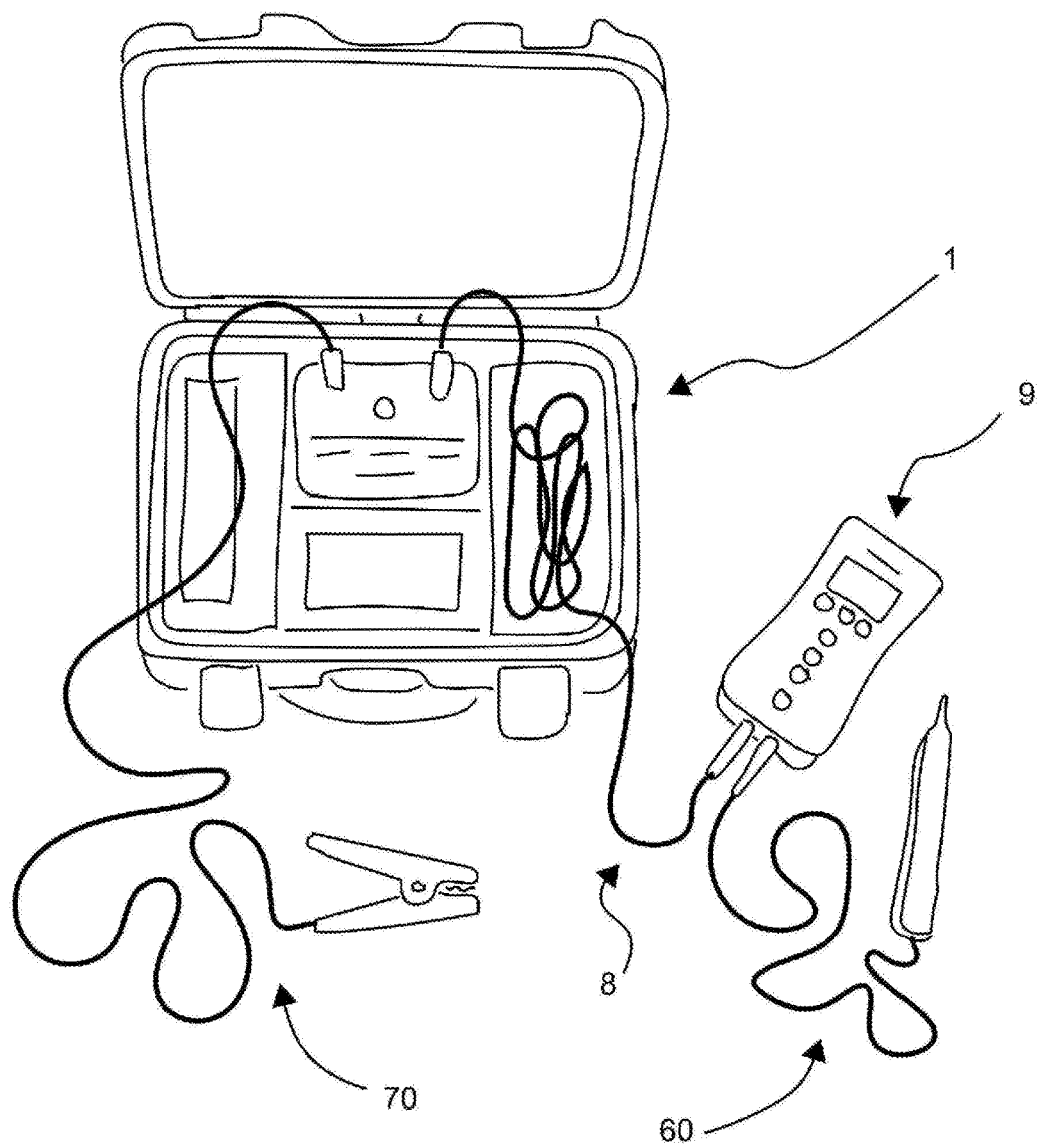
FIG. 7 shows an example of a test system configuration, wherein the mobile unit is directly connected to the base unit.

FIG. 7 shows a typical setup of the continuity test system of the present invention, with the mobile unit 9 connected directly to the base unit 1 via interconnecting lead 8, and also showing the Kelvin Clamp 70 and the Kelvin Probe 60, each of which can be connected to the test item 16 (not shown).

Figure 8:
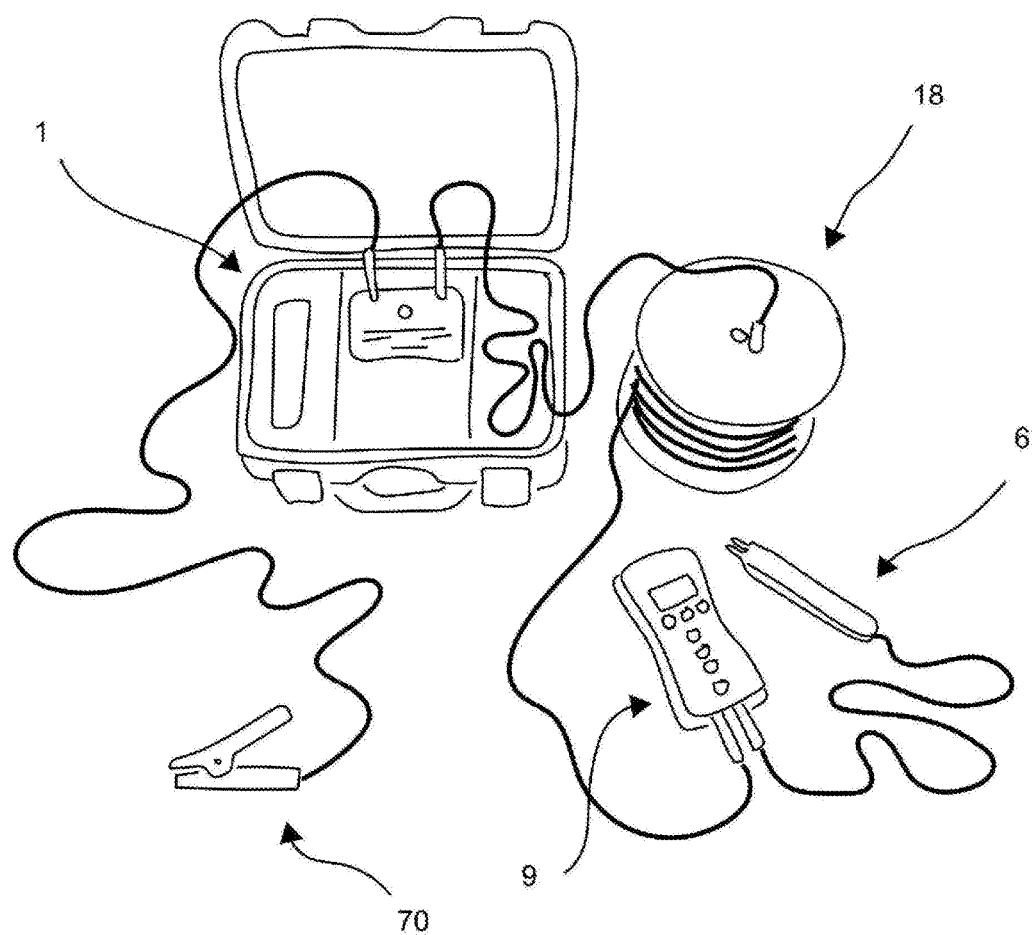
FIG. 8 shows an example of a test system configuration, wherein the mobile unit is connected via a cable reel to the base unit, for application where the mobile unit is to be positioned a significant distance apart from the base unit.

FIG. 8 is similar to FIG. 7, but also incorporating a cable reel 18, which is used when a long interconnecting lead is required between the base unit 1 and the mobile unit 9.

Figure 9:
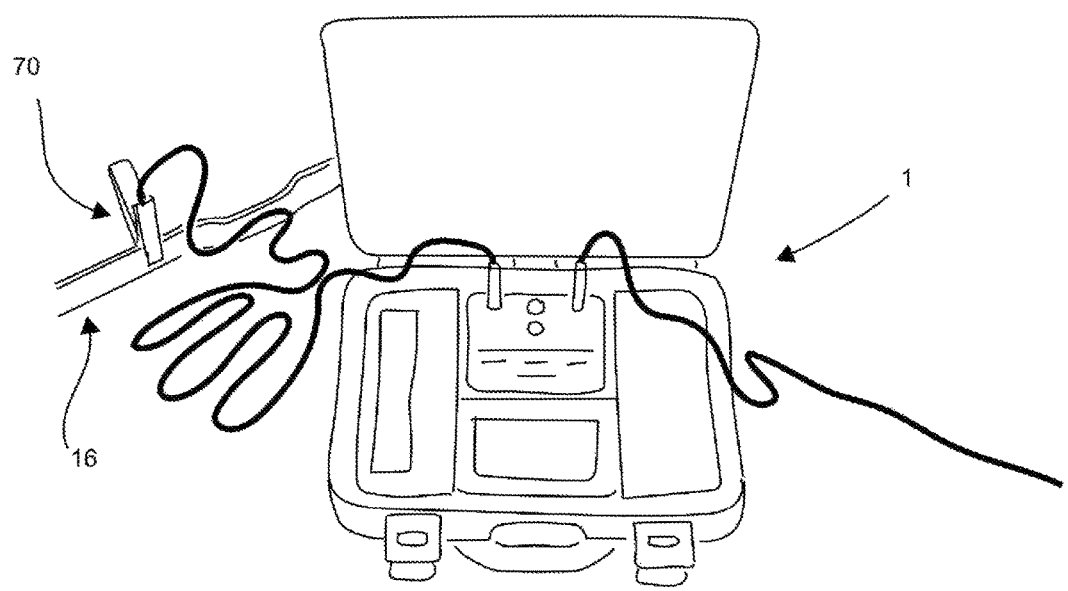
FIG. 9 shows an example of the base unit connected to a reference point of a test item via a Kelvin clamp.

FIG. 9 shows the Kelvin Clamp 70 attached to the base unit 1 being connected to a reference point, or one end of the test item 16.

Figure 10:
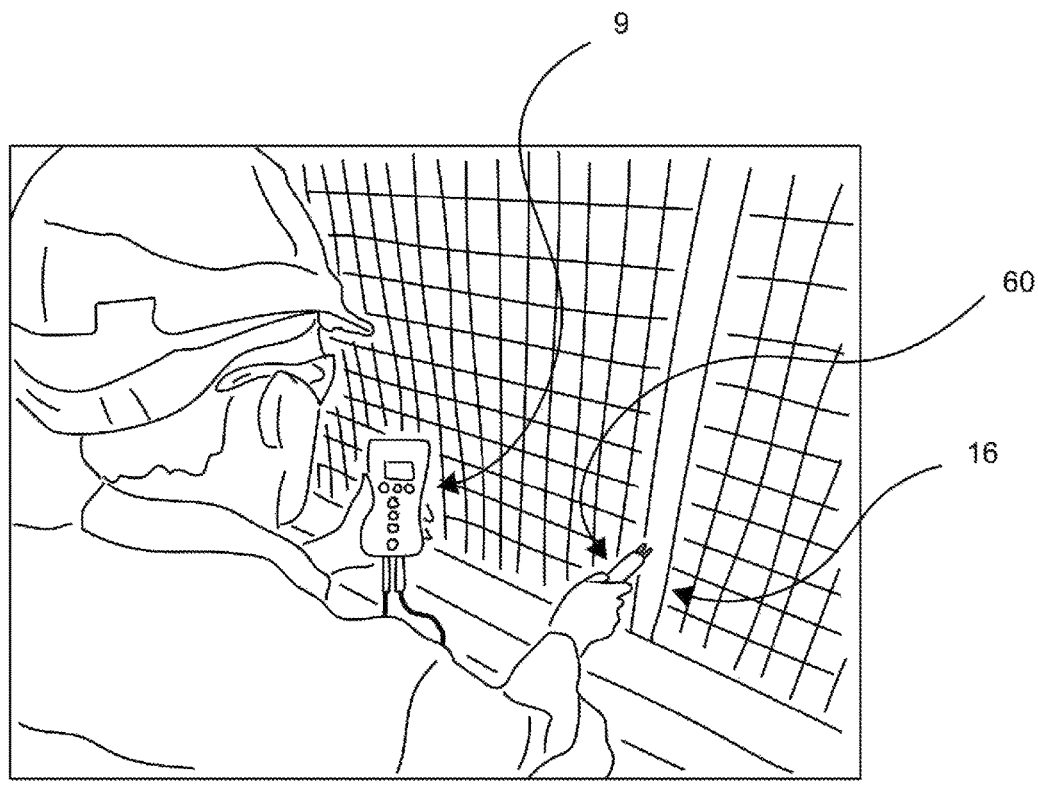
FIG. 10 shows an example of the mobile unit connected to a test item via a Kelvin probe.

FIG. 10 shows the Kelvin Probe 60, attached to the mobile unit 9, being connected to the test item 16.

Figure 11:
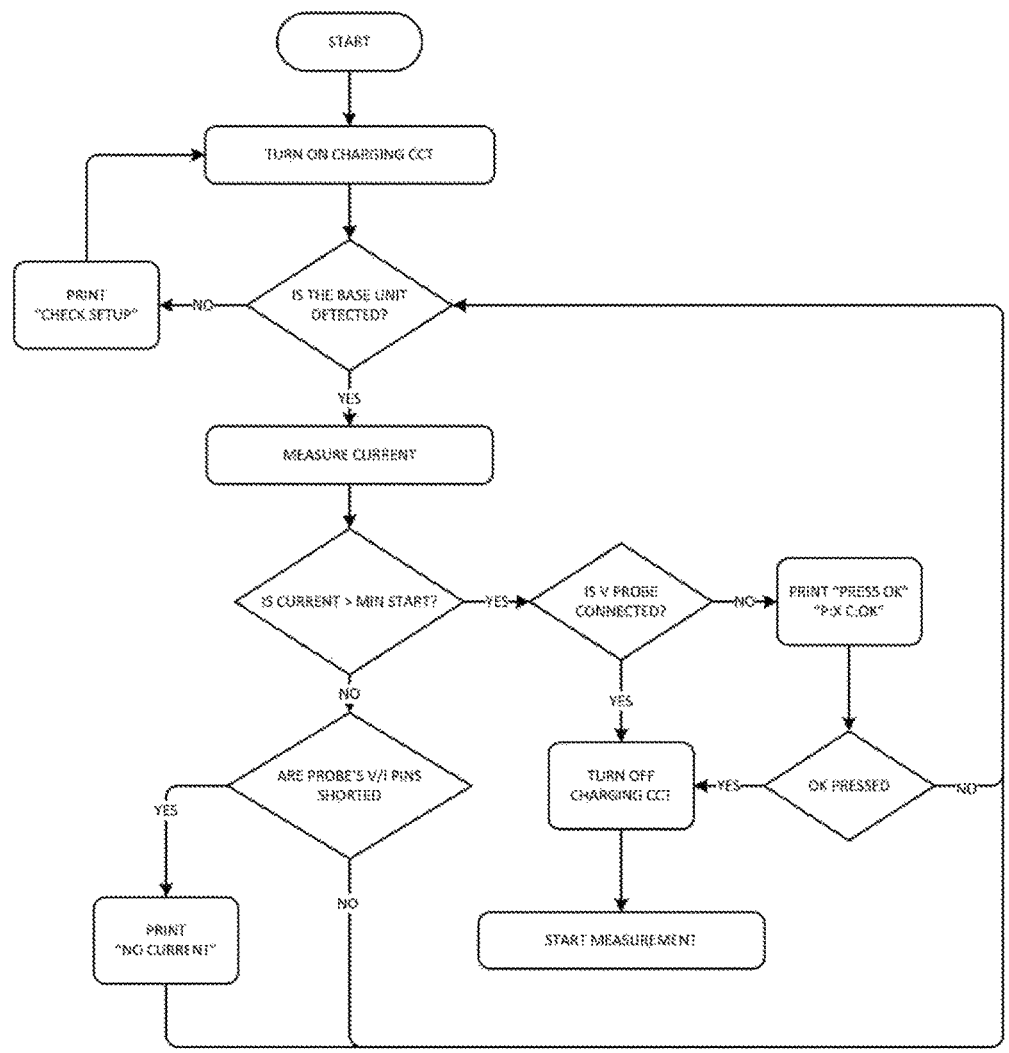
FIG. 11 is a flow chart, illustrating typical "pre-measurement" steps performed by the mobile unit.

FIG. 11 illustrates, in flow chart form, the process by which a "pre-measurement" procedure is implemented in the mobile unit 9, to ensure correct operation prior to performing the continuity test measurements.

Figure 12:
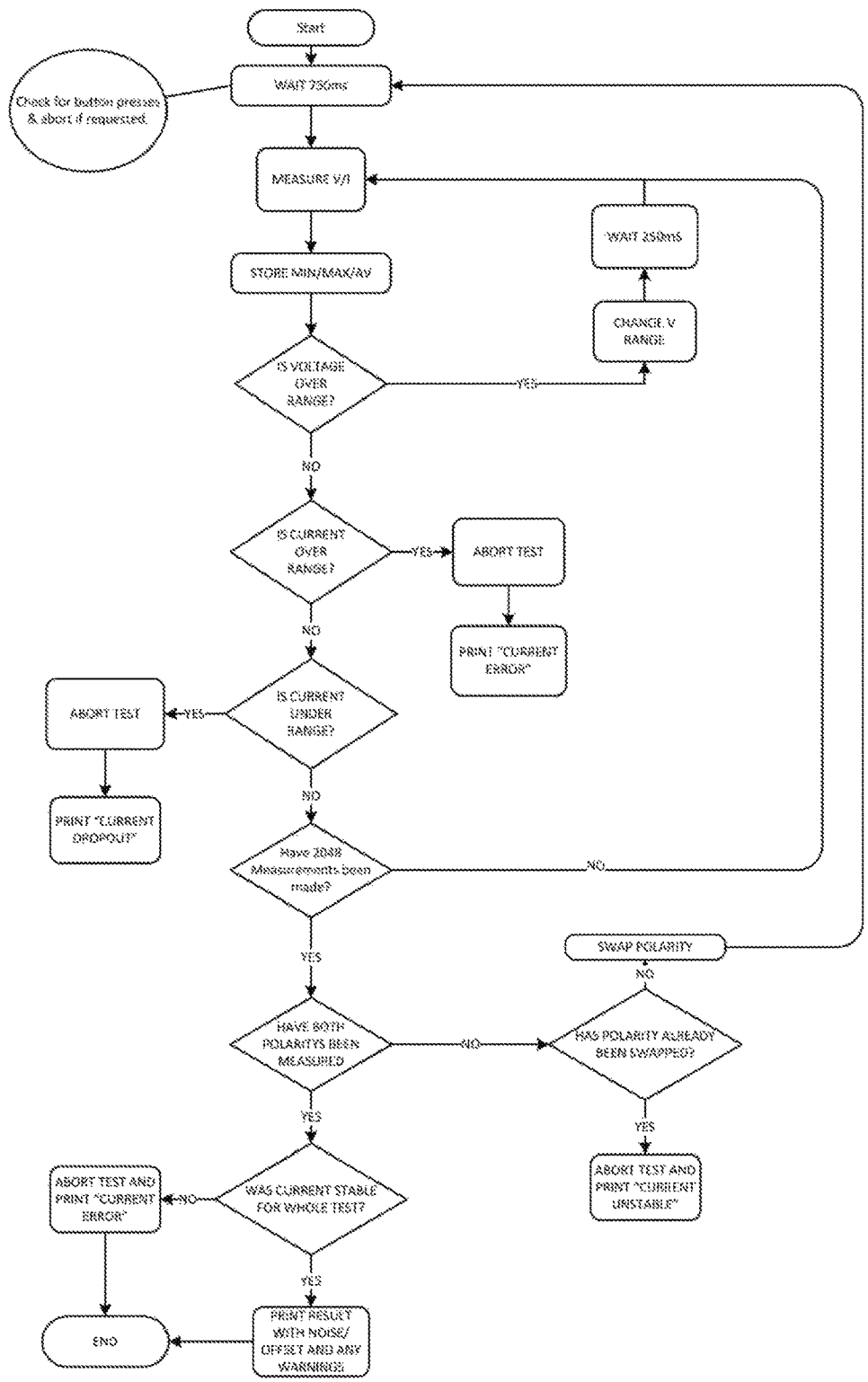
FIG. 12 is a flow chart illustrating typical steps in the measurement process in accordance with the present invention.

FIG. 12 illustrates, also in flow chart form, the process which is implemented in the mobile unit 9 to perform the primary continuity test measurement procedure in accordance with the present invention, including the polarity swapping feature which is unique to the present invention.

Figure 13:
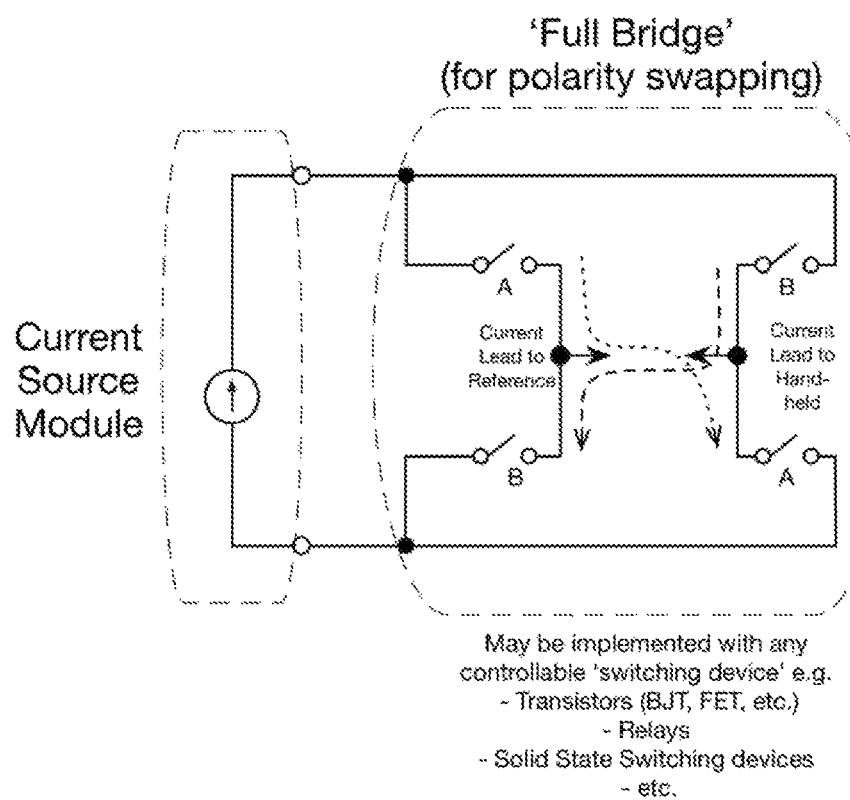
FIG. 13 illustrates the "polarity swapping" technique in accordance with the present invention.

FIG. 13 shows a diagrammatic illustration of a typical switching device which may be used to implement the polarity swapping feature of the present invention.

Figure 14:
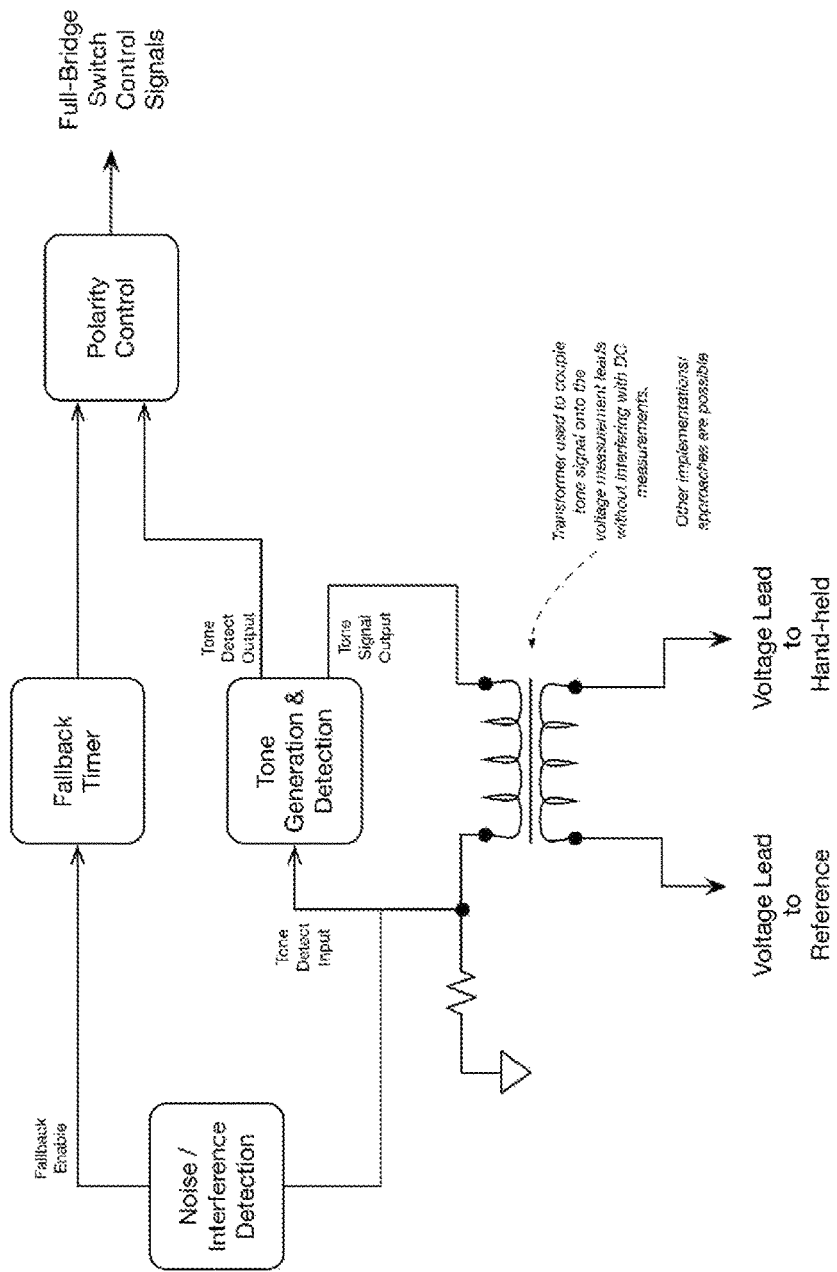
FIG. 14 illustrates the base unit lead integrity signal generator in accordance with the present invention; and, FIG. 15 illustrates the lead integrity signal processing in the mobile unit in accordance with the present invention.

FIG. 14 shows how the lead integrity signal generation and transfer may be implemented in the base unit without interfering with the normal measurement functions of the present invention.

Figure 15:
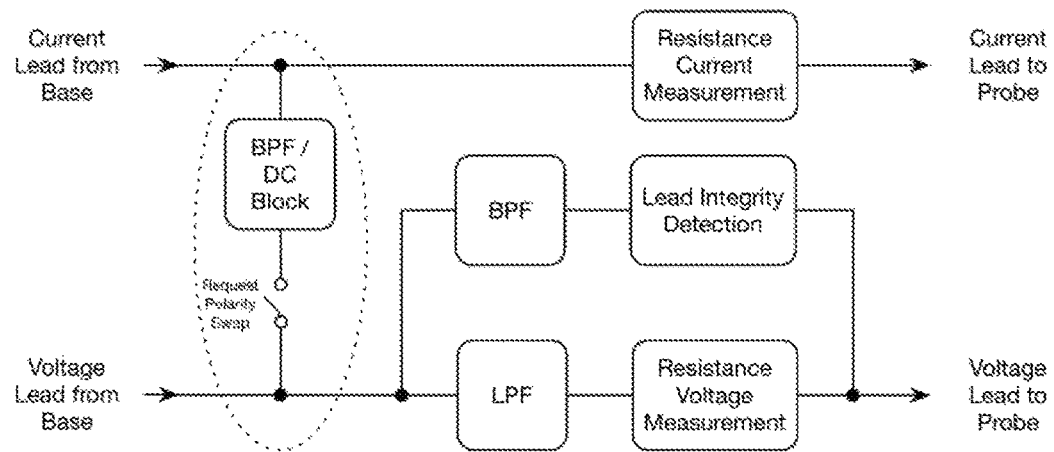

FIG. 15 shows how the lead integrity signal may be processed in the mobile unit of the present invention, without interfering with the normal measurement functions. It also provides detail about how the lead integrity signal may also be used to implement the meter state communications channel that enables the mobile unit to control the test current polarity generated by the base unit.

It will be appreciated that the present invention therefore provides a "split system" which allows the continuity and/or integrity of an entire substation earthing system to be tested.

The system of the present invention has various advantages, including the implementation of a testing regime which is much faster than previously known. This therefore provides direct cost reductions.

The system of the present invention also provides a more robust measurement technique in that it is providing a dual polarity measurement technique. It also enables the ability to detect open and short circuits in the test leads and provide a corresponding alert to the user. The system of the present invention also has the optional ability to charge the batteries between measurements so that the mobile batteries never "run flat".

In the applicant's trial test system various functional features were implemented, including any one or combination of:
    Internal 12V DC battery power supply within the base unit 1

Alternate supply from external mains power supply via plug pack
Low battery voltage protection
System self-power-off when no use for >12 hrs
Fast & trickle charge
Input power reverse polarity protection
Automatic background charging of mobile unit battery from base unit
Linear regulated DC current source for use as measurement signal. (12V supply could be replaced with higher voltage supply for measurements of larger resistances or with larger separation.)
Current and voltage measurement in mobile unit
Digital filtering to mitigate AC interference ("noise")
Remote controlled polarity switching of measurement signal to mitigate DC interference ("offset")
Regular and fast measurement modes
Low range 0.1 mΩ to 200 mΩ, 0.1 mΩ resolution
High range 1 mΩ to 2000 mΩ, 1 mΩ resolution
Interconnecting lead integrity checked every measurement
Self-test mode
Shorted leads check
Detailed measurement information available on mobile unit backlit screen, including:
  Resistance measurements (with auto-range)
  Mean voltage (+& − polarity)
  Mean current (+& − polarity)
  Max & min V & I as % difference to mean
  V & I readings as % of full scale reading
  Min & Max Thresholds (visual & audible warnings)
  'Noise' & 'Offset' warnings (visual & audible)
  Battery volts & charge status.

Outcomes of the applicant's trial using the test system described above typically include:
Resistances between 0.1 mΩ and 2000 mΩ measured accurately (within 1% of range under most conditions).
Measurements achieved quickly (<6 seconds per measurement)
Accuracy maintained with interconnection lead length of 200 m (Note: the system could easily be implemented with a higher voltage supply to achieve measurements of larger resistances or with larger separation).
Measurements achieved with signal to noise ratio of −20 dB (e.g. 1V signal in 10V noise).
Single-user operation achieved without loss of other features.
Lead integrity test detected open circuit and high impedance connection in the interconnecting lead.
Backlit Display readable in daylight conditions.

Where in the foregoing description particular integers are described it is envisaged that their mechanical and/or electrical equivalents can be substituted as if they were set forth herein.

A particular example of the invention has therefore been described. It is envisaged that improvements and modifications will become apparent to persons skilled in the art. All such variations and modifications should be considered to fall within the scope of the invention as hereinbefore described and as hereinafter claimed.

The invention claimed is:
1. A continuity test system including:
a base unit adapted to be connected to a first portion of a test item, and,
a mobile unit adapted to be connected to a second portion of said test item, the mobile unit and the base unit being directly connected through a test lead including two or more conductors;
said continuity system including:
a signal generator, adapted to generate a dual polarity measurement signal;
a measurement unit, adapted to measure electrical parameters of the test item as said dual polarity measurement signal is applied thereto; and,
a processor, adapted to process said electrical parameters and provide a resultant continuity test output.
2. A continuity test system as claimed in claim 1, wherein said electrical parameters include voltage and/or current.
3. A continuity test system as claimed in claim 1, wherein said base unit includes said signal generator.
4. A continuity test system as claimed in claim 1, wherein said mobile unit includes said measurement unit.
5. A continuity test system as claimed in claim 1, wherein said base unit and/or said mobile unit includes said processor.
6. A continuity test system as claimed in claim 1, wherein a communications channel is provided between said base unit and said mobile unit, wherein said communications channel may be a wired or wireless communications channel.
7. A continuity test system as claimed in claim 1, wherein said dual polarity measurement signal is implemented using a controllable switching device, including any one or combination of a transistor (BJT, FET, etc.) a relay, and/or, a solid state switching device.
8. A continuity test system as claimed in claim 1, wherein said electrical parameters are measured using a measurement device including a Kelvin clamp and a Kelvin probe.
9. A continuity test system as claimed in claim 1, including a user interface, having a display, to display said continuity test output.
10. A continuity test method of a continuity test system including:
a base unit adapted to be connected to a first portion of a test item, and,
a mobile unit adapted to be connected to a second portion of said test item, the mobile unit and the base unit being directly connected through a test lead including two or more conductors;
said method including the steps of:
generating a dual-polarity measurement signal;
measuring electrical parameters of the test item as said dual-polarity test signal is applied thereto; and,
processing said electrical parameters to provide a resultant continuity test output.
11. A continuity test method as claimed in claim 10, further including the preliminary step of:
performing a pre-measurement test to verify correct operation/connection of continuity test apparatus components.
12. A continuity test method as claimed in claim 10, wherein said electrical parameters are voltage and/or current.
13. A base unit of a continuity test system, in which the continuity test system further includes a mobile unit, where the base unit is adapted to be connected to a first portion of a test item and the mobile unit is directly connected to said base unit through a test lead including two or more conductors and adapted to be connected to a second portion of said test item, and in which the continuity test system includes:

a signal generator, adapted to generate a dual polarity measurement signal;

a measurement unit, adapted to measure electrical parameters of the test item as said dual polarity measurement signal is applied thereto; and, a processor, adapted to process said electrical parameters and provide a resultant continuity test output.

14. A mobile unit of a continuity test system, in which the continuity test system further includes a base unit, where the base unit is adapted to be connected to a first portion of a test item and the mobile unit is directly connected to said base unit through a test lead including two or more conductors and adapted to be connected to a second portion of said test item, and in which the continuity test system includes:

a signal generator, adapted to generate a dual polarity measurement signal;

a measurement unit, adapted to measure electrical parameters of the test item as said dual polarity measurement signal is applied thereto; and, a processor, adapted to process said electrical parameters and provide a resultant continuity test output.

* * * * *